United States Patent
Maynard et al.

(10) Patent No.: US 12,224,510 B2
(45) Date of Patent: Feb. 11, 2025

(54) CONNECTOR INCLUDING SIGNAL PINS SHIELDED BY BURIED GROUND VIAS

(71) Applicant: Neoconix, Inc., San Jose, CA (US)

(72) Inventors: Woody Maynard, State College, PA (US); Mayuresh Patki, Harrisburg, PA (US); David Chen, Los Altos, CA (US); Gary Hsieh, Taoyuan (TW)

(73) Assignee: Neoconix, Inc., San Jose, CA (US)

( * ) Notice: Subject to any disclaimer, the term of this patent is extended or adjusted under 35 U.S.C. 154(b) by 0 days.

(21) Appl. No.: 18/426,368

(22) Filed: Jan. 30, 2024

(65) Prior Publication Data

US 2024/0170867 A1    May 23, 2024

Related U.S. Application Data

(63) Continuation of application No. 17/495,770, filed on Oct. 6, 2021, now Pat. No. 11,967,782.

(60) Provisional application No. 63/113,128, filed on Nov. 12, 2020.

(51) Int. Cl.
| | |
|---|---|
| *H01R 12/52* | (2011.01) |
| *H01R 12/57* | (2011.01) |
| *H01R 12/71* | (2011.01) |
| *H01R 13/24* | (2006.01) |
| *H01R 13/6471* | (2011.01) |
| *H05K 1/02* | (2006.01) |
| *H05K 3/40* | (2006.01) |
| *H05K 7/10* | (2006.01) |

(52) U.S. Cl.
CPC ............ *H01R 12/52* (2013.01); *H01R 12/57* (2013.01); *H01R 12/714* (2013.01); *H01R 13/2407* (2013.01); *H01R 13/6471* (2013.01); *H05K 1/0219* (2013.01); *H05K 3/4092* (2013.01); *H05K 7/1069* (2013.01)

(58) Field of Classification Search
CPC .... H01R 12/52; H01R 12/523; H01R 12/526; H01R 12/55; H01R 12/597; H01R 12/712; H01R 12/714; H01R 13/2407; H01R 13/6471; H05K 1/0219; H05K 3/4092; H05K 7/1069
USPC .......................................................... 439/66
See application file for complete search history.

(56) References Cited

U.S. PATENT DOCUMENTS

| | | | |
|---|---|---|---|
| 7,113,408 | B2 | 9/2006 | Brown et al. |
| 7,371,073 | B2 | 5/2008 | Williams |
| 2004/0252477 | A1 | 12/2004 | Brown et al. |
| 2004/0253846 | A1 | 12/2004 | Brown et al. |
| 2004/0253875 | A1 | 12/2004 | Brown et al. |
| 2022/0149550 | A1 | 5/2022 | Maynard et al. |

*Primary Examiner* — Khiem M Nguyen

(57) ABSTRACT

A connector for electrically connecting to conductive structures formed on a semiconductor device includes a core with first, second and third ground planes isolated from each other and signal vias and ground vias formed therein, conductive signal traces formed coplanar with the second ground plane and isolated from a conductive ground layer forming the second ground plane, where one or more conductive signal traces are shielded by the conductive ground layer and by the first and third ground planes. The connector includes a first set of contact elements electrically connected to signal vias that are electrically connected to first ends of the conductive signal traces and a second set of contact elements electrically connected to signal vias that are electrically connected to second ends of the conductive signal traces.

18 Claims, 16 Drawing Sheets

US 12,224,510 B2

CONNECTOR INCLUDING SIGNAL PINS SHIELDED BY BURIED GROUND VIAS

CROSS REFERENCE TO RELATED APPLICATIONS

This application is a continuation of U.S. patent application Ser. No. 17/495,770, entitled CONNECTOR INCLUDING SIGNAL PINS SHIELDED BY BURIED GROUND VIAS, filed Oct. 6, 2021, now U.S. Pat. No. 11,967,782, issued Apr. 23, 2024, which claims priority to U.S. Provisional Patent Application No. 63/113,128, entitled CONNECTOR INCLUDING SIGNAL PINS SHIELDED BY BURIED GROUND VIAS, filed Nov. 12, 2020, which applications are incorporated herein by reference in their entireties.

FIELD OF THE INVENTION

The invention relates to reconnectable, remountable electrical connectors, and, in particular, to an electrical connector including shielded signal contact elements.

BACKGROUND OF THE INVENTION

Electrical interconnects or connectors are used to connect two or more electronic components together or to connect an electronic component to a piece of electrical equipment, such as a computer, router, or tester. For instance, an electrical interconnect is used to connect an electronic component, such as an integrated circuit (an IC or a chip), to a printed circuit broad. An electrical interconnect is also used during integrated circuit manufacturing for connecting an IC device under test to a test system. In some applications, the electrical interconnect or connector provides separable or remountable connection so that the electronic component attached thereto can be removed and reattached. For example, it may be desirable to mount a packaged microprocessor chip to a personal computer mother board using a separable interconnect device so that malfunctioning chips can be readily removed or upgraded chips can be readily installed.

The ability to make separable electrical contact with contacts of semiconductor scale electronic circuits has become more problematic as the mechanical, electrical, and reliability requirements of these electrical contacts become more demanding. Nano springs, pogo pins, micro springs, and other miniature contact devices have been developed to deal with the problem of making reliable electrical contact between semiconductor integrated circuits or between a semiconductor integrated circuit and an electronic system, such as one built on a printed circuit board (PCB). In some examples, conventional electrical connectors are made of stamped metal springs, which are formed and then individually inserted into an insulating carrier to form an array of electrical connector elements. Other approaches to making electrical connectors include using isotropically conductive adhesives, injection molded conductive adhesives, bundled wire conductive elements, springs formed by wire bonding techniques, and small solid pieces of metal.

Land grid array (LGA) refers to an array of metal pads (also called lands) that are used as the electrical contact points for an integrated circuit package, a printed circuit board, or other electronic component. The metal pads are usually formed by lithographically defining and etching them on an isolating surface or substrate. It is common to then coat the surface with a gold film or other noble metal to provide a non-oxidizing surface. Ball Grid array (BGA) refers to an array of solder balls or solder bumps that are used as the electrical contact points for an integrated circuit package. Both LGA and BGA packages are widely used in the semiconductor industry and each has its associated advantages or disadvantages. For instance, LGA packages are typically cheaper to manufacture than ball grid array (BGA) packages because there is no need to form solder balls or solder bumps. However, LGA packages are typically more difficult to assemble onto a PC board or a multi-chip module. An LGA connector is usually used to provide removable and remountable socketing capability for LGA packages connected to PC boards or to chip modules Advances in semiconductor technologies has led to shrinking dimensions within semiconductor integrated circuits and particularly, decreasing pitch for the contact points on a silicon die or a semiconductor package. The pitch, that is, the spacing between each electrical contact point (also referred to as a "lead") on a semiconductor device is decreasing dramatically in certain applications. For example, contact pads on a semiconductor wafer can have a pitch of 250 micron or less. At the 250-micron pitch level, it is prohibitively difficult and very expensive to use conventional techniques to make separable electrical connections to these semiconductor devices. The problem is becoming even more critical as the pitch of contact pads on a semiconductor device decreases below 50 microns and simultaneous connection to multiple contact pads in an array is required.

BRIEF DESCRIPTION OF THE DRAWINGS

Various embodiments of the invention are disclosed in the following detailed description and the accompanying drawings.

DETAILED DESCRIPTION OF THE INVENTION

In embodiments of the present disclosure, a separable and reconnectable connector includes a contact array including signal pins that are shielded by ground pins and by buried ground vias. In some embodiments, a signal pin or a pair of signal pins in the contact array is surrounded by at least one ground pin and one or more buried ground vias. In this manner, signal pins, whether single-ended or differential pair, can be used to transmit signals with reduced cross-talk and improved signal integrity. Meanwhile, the connector maintains a compact size while the signal pins are provided with ground shielding from adjacent signal pins through the ground pins or ground vias.

Figure 1:
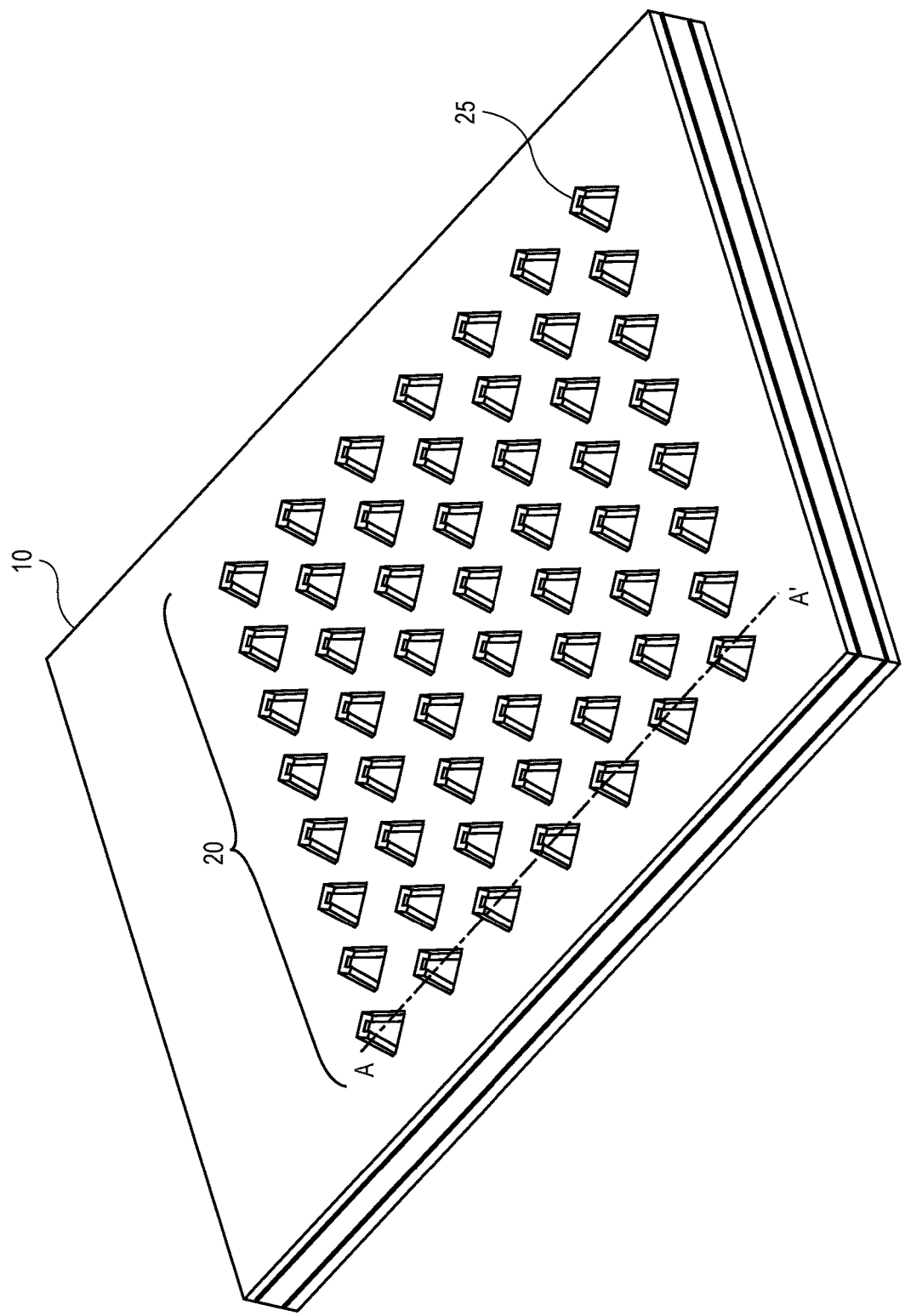
FIG. 1 is a perspective view of a representative interposer or connector in embodiments of the present disclosure.

FIG. 1 is a perspective view of a representative interposer or connector in embodiments of the present disclosure. In embodiments of the present disclosure, the connector is applied to use as an interposer and the terms "connector" and "interposer" will be used interchangeably in the present description. Referring to FIG. 1, an interposer 10 includes a contact array 20 including contact elements 25 formed on a first surface (e.g. top surface) of an isolation core and corresponding contact elements formed on a second, opposite surface (e.g. bottom surface) of the isolation core. The contact elements formed on the second surface are not shown in FIG. 1 but will be illustrated in the following figures. Conductive vias formed in the isolation core connect contact elements 25 formed on one surface to corresponding contact elements formed on the other surface. In the present embodiment, the contact array 20 is formed as a two-dimensional array of contact elements. The two-dimensional array configuration is illustrative only and not intended to be limiting. The contact elements 25 can be arranged in any configuration or design necessary for the components to be connected thereto.

In the present description, the contact elements 25 formed on the first surface of the isolation core are illustrated as compliant spring contact elements. In other embodiments, the contact array 20 may be formed as a land grid array or a ball grid array. Other types of contact elements can be used depending on the components to which the interposer is to be connected. Furthermore, the contact elements on the first surface and the contact elements on the second surface may use different types of contact elements. For example, the contact elements on the first surface may be a set of compliant spring elements whereas the contact elements on the second surface may be a ball grid array. The contact elements used for the contact array in the interposer is selected based on the type of contact structures of the component to which the interposer is to be coupled. In some examples, the interposer is to be coupled to semiconductor components and the contact elements are configured to connect to conductive pads formed on the semiconductor components.

In some embodiments of the present disclosure, planar contact elements are first formed into a thin conductive plane or sheet of elastic material. The resultant planar compliant spring elements are then mechanically formed upward and away from the surface of the conductive sheet of elastic material. Subsequent processing allows this sheet or plane of three-dimensional features to be attached to an isolating substrate containing conductive vias formed therein. The spring elements can then be electrically connected to vias previously fabricate in the isolating substrate by a metallization process. Discrete spring elements may then be singulated into discrete contact probes or contact elements and may be referred to as flanges in the present disclosure.

In embodiments of the present disclosure, the interposer or connector 10 can be used to make electrical connections from components such as a Printed Circuit Board (PCB) to another PCB, to a central processing unit or microprocessor, or to a network processor unit, or to a neural processing unit, or to a graphic processing unit, or other semiconductor device. Furthermore, the interposer or connector can be used to make electrical connections to electrical contact points formed on any electronic components. For example, the electrical contact points can be an array of metal pads, such as a land grid array, that are used as the electrical contact points for an integrated circuit package, a printed circuit board, or other electronic component. The interposer or connector of the present disclosure can be used to connect to a land grid array formed on a printed circuit board or formed on a semiconductor chip or other devices.

Figure 2:
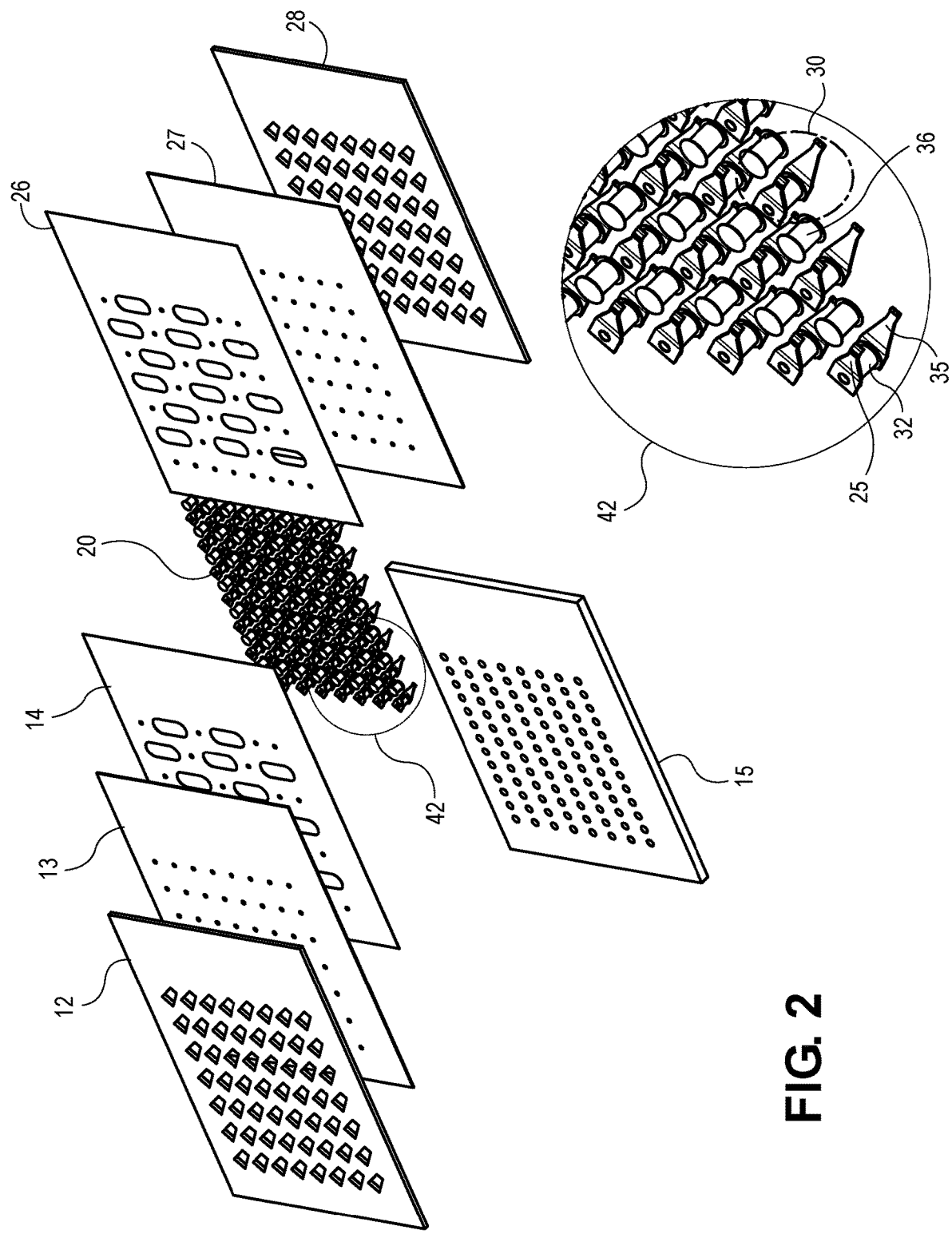
FIG. 2 is an exploded view of the interposer of FIG. 1 in embodiments of the present disclosure.

FIG. 2 is an exploded view of the interposer of FIG. 1 in embodiments of the present disclosure. Referring to FIG. 2, in some embodiments, the construction of the interposer 10 of the present disclosure includes a top coverlay isolation layer 12, a top adhesive layer 13, a top ground plane 14, an isolation layer 15 as the core, a bottom ground plane 26, a bottom adhesive layer 27 and a bottom coverlay isolation layer 28. The top or bottom coverlay isolation layer 12, 28 is applied to encapsulate the interposer 10, with openings to expose the spring element of the contact elements. In some embodiments, the coverlay isolation layer may be a thin, semi-rigid material. Top adhesive layer 13 is applied to attach the top coverlay isolation layer 12 to the top ground plane 14. The bottom adhesive layer 27 is applied to attach the bottom coverlay isolation layer 28 to the bottom ground plane 26. The top and bottom ground plane 14, 26 are made of conductive material, such as copper. In some embodiments, the core 15 is made of an epoxy laminate material, such as an FR4 composite material, polyimide or other types of isolating substrates.

Conductive vias 32 are formed in the isolation layer 15 to connect contact elements 25 formed on the top surface to corresponding contact elements 35 formed on the bottom surfaces. Contact elements 25, 35 are arranged to form a contact array 20. In the present illustration, the contact array 20 includes a two-dimensional array of contact structures 30 arranged in the layers to form signal pins and ground pins. In particular, as shown in the magnified view denoted by a circle 42, each contact structure 30 includes a conductive via 32 formed in the isolation layer 15 and contact elements 25, 35 on both surfaces of the interposer and connected by a conductive via 32. In the present embodiment, the same type of contact elements 25, 35 is used for the top surface and the bottom surface and the contact elements are illustrated as compliant spring probes. The contact structures 30 shown in FIG. 2 are illustrated only and not intended to be limiting. In other embodiments, other types of contact elements may be used and different types of contact elements may be used on the two surfaces of the interposer. In embodiments of the present disclosure, the contact elements and the conductive vias can be formed using any process currently known or to be developed.

It is instructive to note that the exploded view of FIG. 2 and other exploded views in the following description are provided to illustrate the various layers forming the interposer of the present disclosure. The exploded views are not intended to illustrate the actual order of elements or the actual construction of the interposer. For example, for ease of illustration, the contact structures 30 are shown formed together including contact elements 25, 35 formed on both ends of the conductive vias 32. In actual practice, the conductive vias 32 are formed in the isolation layer 15 (the core) and the contact elements 25, 35 are formed above the top adhesive layer 13 or below the bottom adhesive layer 27 and attached to the conductive vias 32 through openings in the adhesive layers. The exploded views in the present description are provided for illustrative purpose only.

In embodiments of the present disclosure, conductive vias 32 are formed in the isolation layer 15 for providing electrical connection between corresponding contact elements 25, 35 formed on the top and bottom surfaces of the interposer 10. Moreover, the interposer 10 also includes conductive vias 36 formed in the isolation layer 15 that are not provided with contact elements or flanges. As will be explained in more details below, the flange-less vias 36 are used as ground connections to provide effective shielding of signal pins of the interposer while enabling a compact dimension for the interposer.

In some embodiments, a subset of the contact structures 30 in the interposer 10 are signal pins and includes contact elements 25, 35 formed on conductive vias 32 designated for the signal pins. The conductive vias used for signal pins are referred herein as "signal vias" 34. The signal vias 34 and corresponding contact elements 25, 35 are isolated from the ground planes (such as top and bottom ground planes 14, 26), such as by slots or openings formed in the ground planes.

Furthermore, in some embodiments, the interposer 10 includes a subset of conductive vias 32 that are designated for ground connection. For example, the subset of conductive vias 32 may be electrically connected to either the top ground plane 14 or the bottom ground plane 26, or both, and are referred herein as "ground vias." A subset of the contact structures 30 in the interposer 10 are ground pins and includes contact elements 25, 35 formed on the ground vias. The interposer 10 further includes ground vias 36 that are not connected to any contact elements and are referred herein as hidden or buried ground vias.

As thus configured, a signal pin or a pair of signal pins is formed surrounded by one or more ground pins and one or more buried ground vias. In this manner, the buried ground vias provide shielding to each signal pin or each pair of signal pins while maintaining a compact size for the interposer. The signal pins may be single-ended signal pins. In some embodiments, a pair of signal pins may be used to form a differential signal pair. In that case, each pair of signal pins forming a differential signal pair is provided with ground shielding to reduce crosstalk and improve signal integrity.

Figure 3:
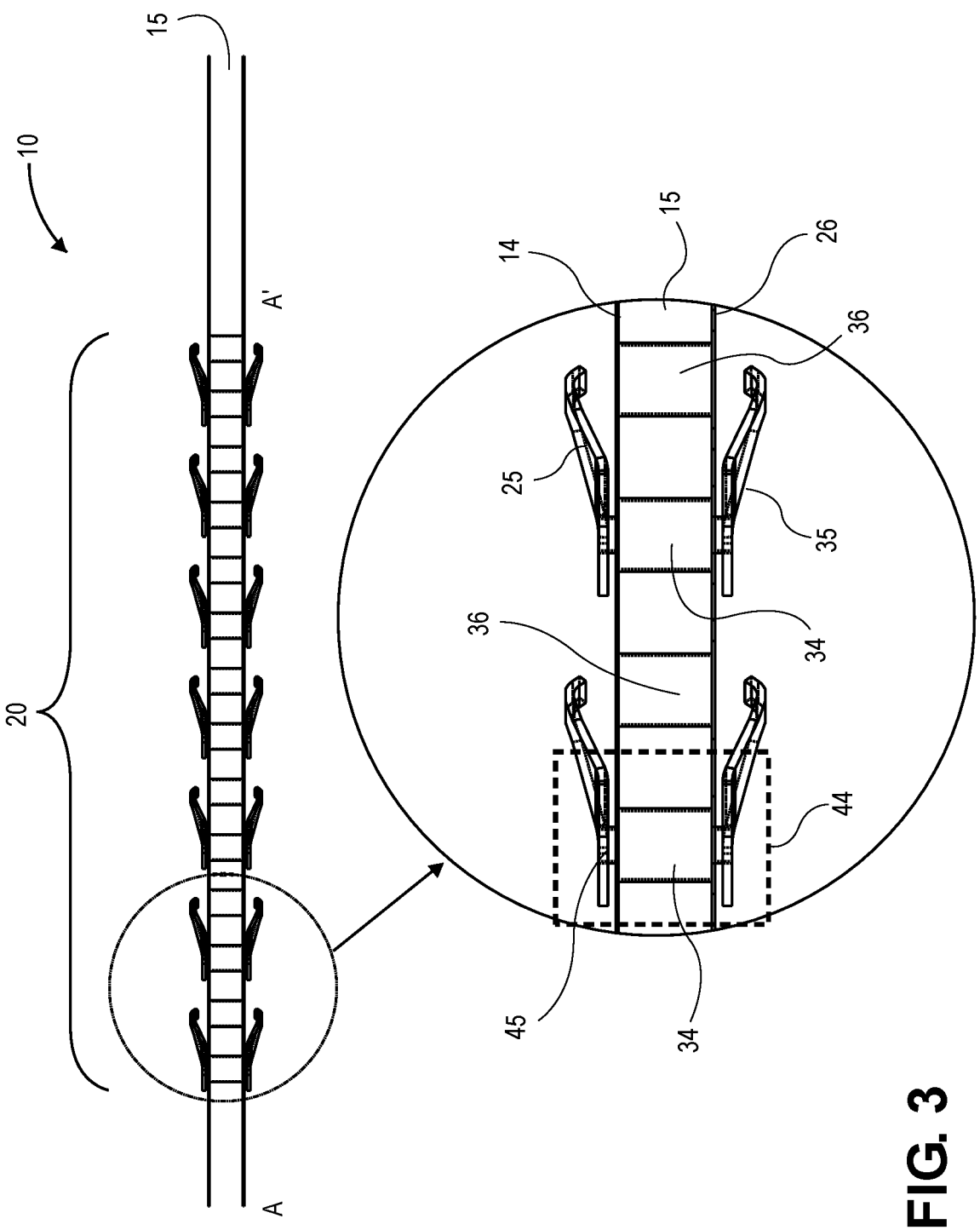
FIG. 3 is a cross-sectional view of the contact array of the interposer of FIG. 1 in embodiments of the present disclosure.

FIG. 3 is a cross-sectional view of the contact array of the interposer of FIG. 1 in embodiments of the present disclosure. In particular, FIG. 3 illustrates the cross-sectional view of the contact array 20 along a line A-A' in FIG. 1. Referring to FIG. 3, the interposer 10 includes an isolation layer 15 (the core) with conductive vias formed therein. The conductive vias can be signal vias 34 or ground vias 36. The interposer 10 includes signal pins 44 formed by a contact structure including a signal via 34 and corresponding contact elements 25, 35 formed on top and bottom surfaces of the isolation layer 15 and attached to as well as electrically connected to the signal via 34. In the present embodiment, the contact elements 25, 35 on the top and bottom surfaces are formed using the same type of compliant spring element for the purpose of illustration. Each contact element 25, 35 is electrically connected to the respective conductive via 34 through a contact connection via 45. The interposer 10 further includes buried ground vias 36 formed adjacent to each signal via 34. The buried ground vias 36 are formed in the core 15 of the interposer 10 and are not provided with contact elements. The buried ground vias 36 are electrically connected to the upper ground plane 14 or the lower ground plane 26 or both. As thus configured, the buried ground vias 36 provide shielding to the adjacent signal vias 34 while allowing the vias to be formed using a smaller pitch or smaller dimension that would be needed if contact elements are to be included for the buried ground vias 36. As a result, the overall dimension of the interposer 10 can be made more compact without sacrificing signal integrity.

In embodiments of the present disclosure, the conductive vias are formed in openings formed in the isolation layer 15. In some examples, a conductive via is formed as a conductive layer lining the sidewall of an opening formed in the isolation layer, as shown by the dotted lines along the sidewalls of the openings in FIG. 3. In other words, in some examples, a conductive via may be an angular ring of conductive material formed on the sidewall of an opening in the isolation layer. The opening may remain hollow except for the conductive sidewall. In one example, the sidewall conductive layer may be a copper layer formed by electroplating. In other examples, a conductive via can be formed using any type of conductive material to establish electrical connection. In other embodiments, a conductive via can be formed using other alternative conductive materials, such as conductive paste, fuzz buttons, metal pins or slugs placed into openings in the isolation layer. Furthermore, in embodiments of the present disclosure, a ground via refers to any conductive element formed in the isolation layer and connected to a ground plane. The conductive via can be a conductive sidewall layer or any type of conductive interconnect that is formed in the opening in the isolation layer.

In the present embodiment, the interposer 10 includes the upper ground plane 14 and the lower ground plane 26 formed on the top and bottom surfaces of the core 15. In other embodiments, the interposer 10 may include other plane configurations, including ground planes, power planes and thermal planes. In embodiments of the present disclosure, conductive vias may be designed to be electrically connected to any type of plane configuration, such as ground or power, and are referred herein as "interconnect vias." A subset of the contact structures in the interposer are ground pins and includes contact elements formed on interconnect vias that are connected to the ground plane and also referred to as ground vias. The interposer 10 further includes interconnect vias that are connected to a ground plane but not connected to any contact elements and are referred herein as buried ground vias.

In particular, in alternate embodiments, the interposer 10 may include a ground plane formed in the core 15 and not on the surfaces of the core. Alternatively, the interposer 10 may include one or more ground planes formed on the surface of the core 15 and/or in the core 15. In one embodiment, the interposer 10 includes three ground planes—a top ground plane, a middle ground plane and a bottom ground plane, where the top and bottom ground planes are formed on the top and bottom surfaces of the interposer and the middle ground plane is formed in the core 15. In another embodiment, the interposer 10 includes four ground planes, including two surface ground planes and two ground planes formed in the core 15.

Figure 4:
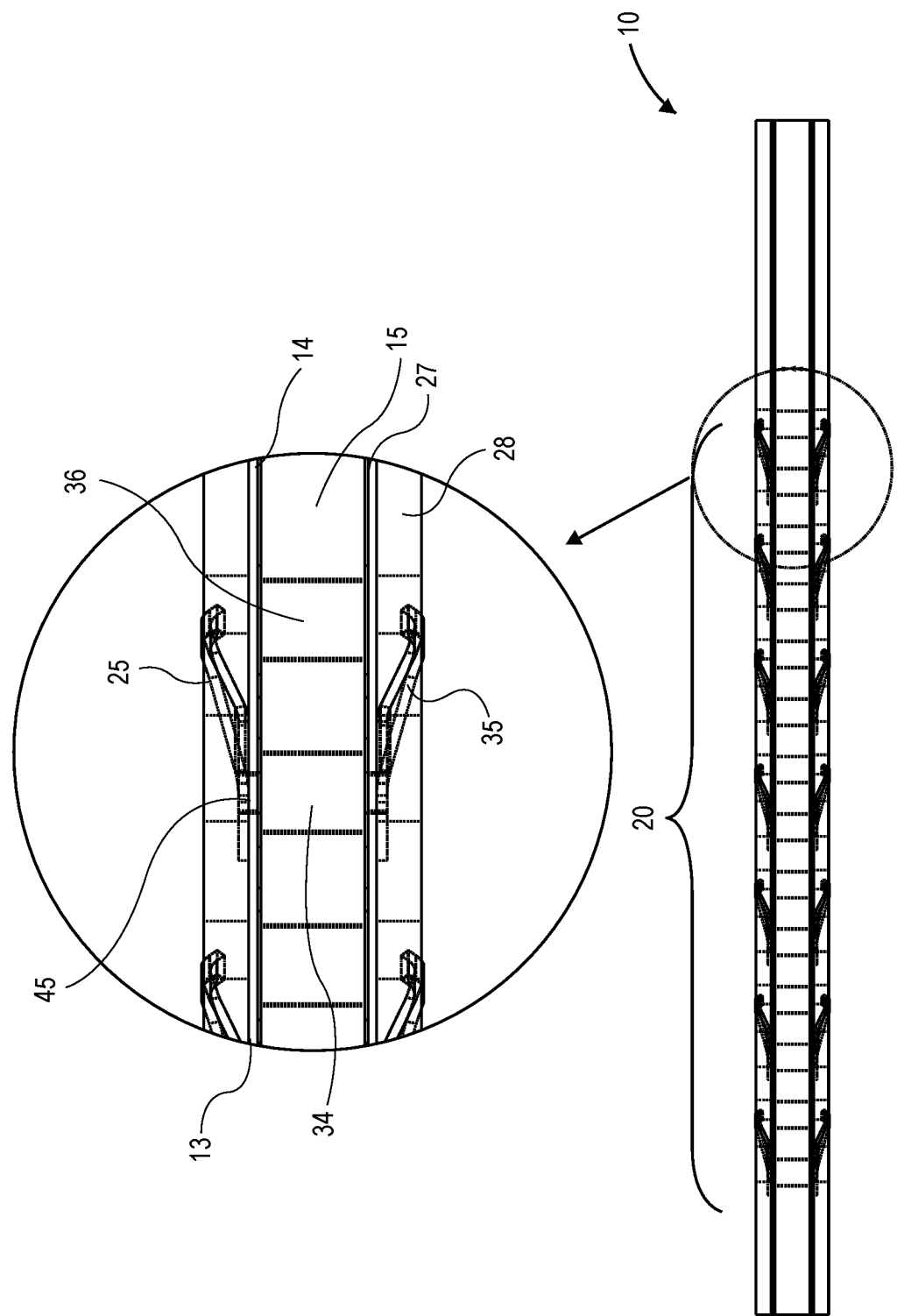
FIG. 4 is a cross-sectional view of the contact structures of the interposer of FIG. 1 in embodiments of the present disclosure.

FIG. 4 is a cross-sectional view of the contact structures of the interposer of FIG. 1 in embodiments of the present disclosure. FIG. 4 illustrates the cross-sectional view of the contact array 20 along a line A-A' in FIG. 1. In particular, FIG. 4 illustrates the interposer including the coverlay isolation layers 12, 28 and the adhesive layers 13, 27.

Figure 5:
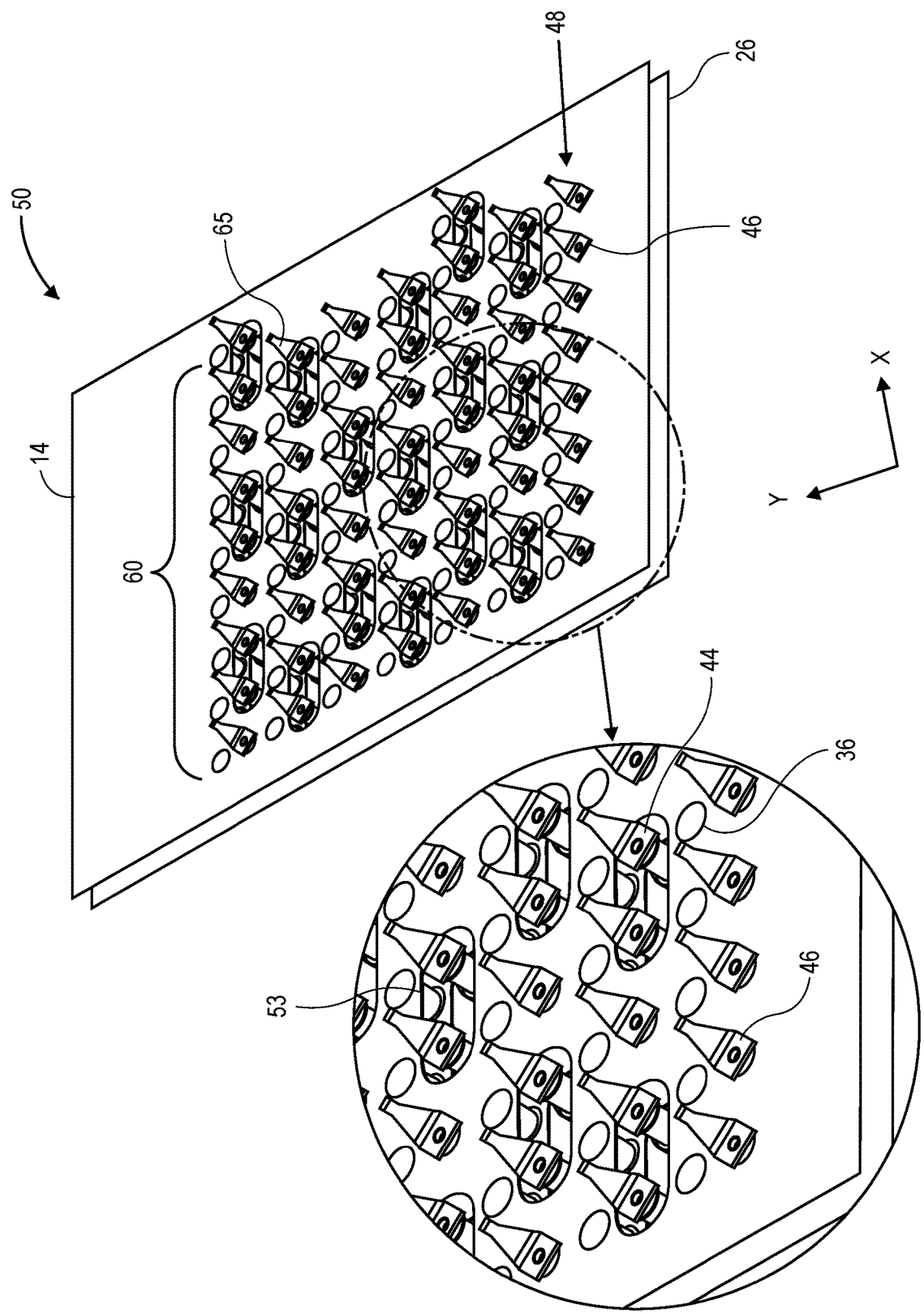
FIG. 5 is a perspective view of an interposer in alternate embodiments of the present disclosure.

FIG. 5 is a perspective view of an interposer in alternate embodiments of the present disclosure. Like elements in FIGS. 1-5 are given like reference numerals to simplify the discussion. Referring to FIG. 5, an interposer 50 includes a contact array 60 including contact elements 65 formed on the top surface and corresponding contact elements formed on the bottom surface (not shown). The interposer 50 includes upper and lower ground planes 14, 26, signal pins 44, ground pins 46 and buried ground vias 36. The signal pins 44 and the ground pins 46 are arranged in a two-dimensional array to form the contact array 60 of the interposer 50. The signal pins 44 are isolated from the top (upper) ground plane 14 and bottom (lower) ground plane 26 by slots or openings 53 formed in the ground planes 14, 26. The slots or openings 53 are sometimes referred to as "ground slots" in the present description. Meanwhile, the ground pins 46 are electrically connected to at least one of the ground planes. In the present illustration, the contact array 60 includes a row of ground pins 46, referred to as ground pin row 48. In some applications, when the interposer 50 is applied to be connected to a component, the ground pins 46 in the ground pin row 48 are used to connect to the ground connection of the component to receive the ground potential which is then used to bias the connected ground plane(s), such as ground plane 14 or 26, to the same ground potential.

In the present embodiment, a pair of signal pins 44 are grouped and used as a differential signal pair. The contact array 60 is arranged so that each pair of signal pins 44 is shielded from adjacent pairs of signal pins 44 by at least one ground pin 46, or at least one buried ground via 36, or a combination thereof. In this manner, each pair of signal pins 44 are shielded from adjacent pairs of signal pins 44, even though pairs of signal pins are not necessarily separated by ground pins in between.

Figure 6:
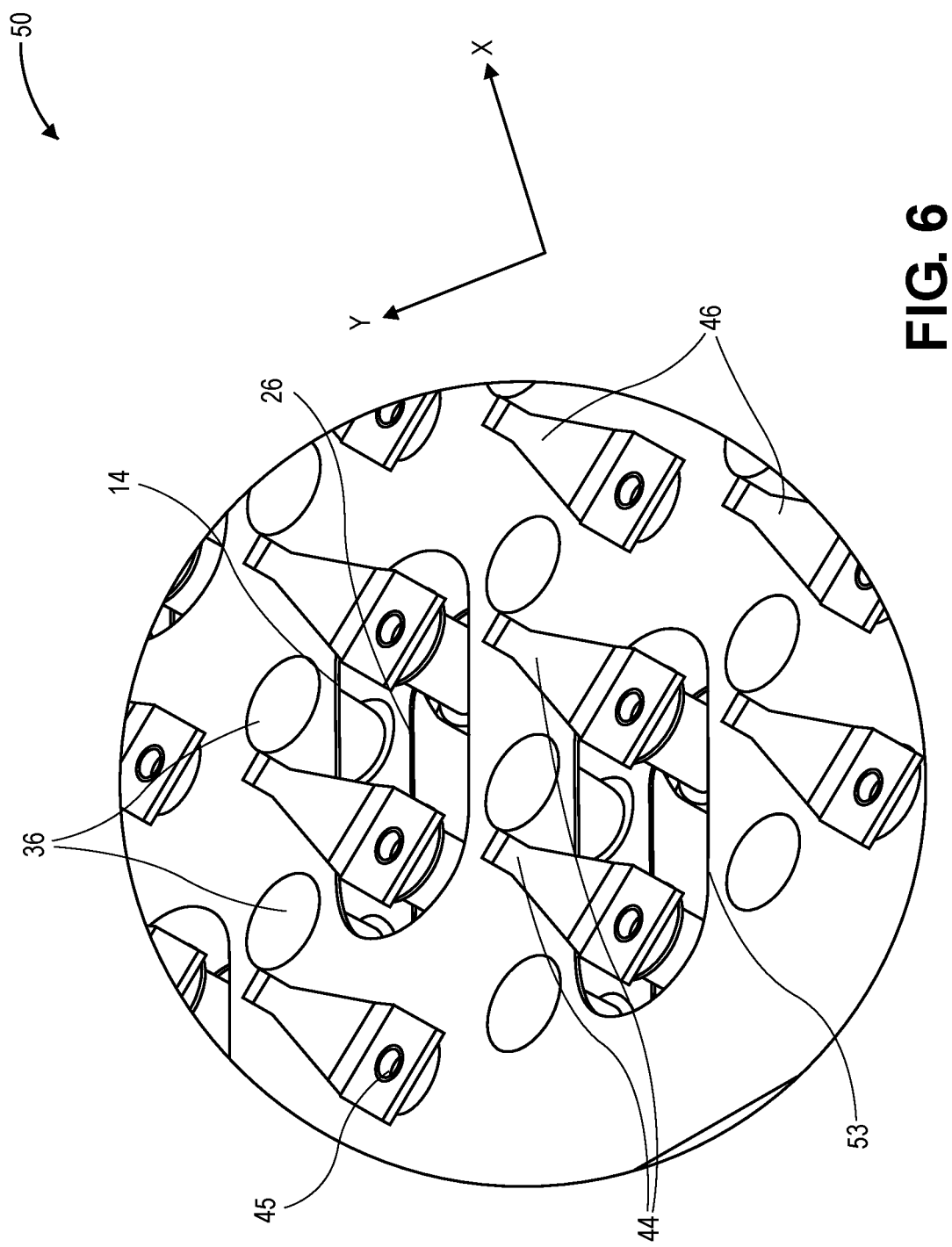
FIG. 6 illustrates an exploded view of the contact structure in the contact array of FIG. 5 in embodiments of the present disclosure.

FIG. 6 illustrates an exploded view of the contact structure in the contact array of FIG. 5 in embodiments of the present disclosure. As shown in FIGS. 5 and 6, in the present embodiment, pairs of signal pins 44 are formed along a row in a first direction (for example, the X-direction). Along a row of signal pins 44, adjacent pairs of signal pins 44 are isolated from each other by at least one ground pin 46. Pairs of signal pins 44 are formed in a column extending in a second direction orthogonal or perpendicular to the first direction (for example, the Y-direction). The pairs of signal pins 44 in a column in the second direction may be arranged in an offset alignment from the pairs of signal pins 44 in another column. Adjacent pairs of signal pins 44 formed in the second direction are not isolated from each other by any ground pins. Instead, one pair of signal pins 44 may be formed adjacent to another pair of signal pins in the second direction. According to embodiments of the present disclosure, adjacent pairs of signal pins 44 in the second direction are isolated from each other by one or more buried ground vias 36. By using buried ground vias 36 between adjacent pairs of signal pins 44 in adjacent rows in the second direction, the signal pins 44 on adjacent rows can be shielded while maintaining a compact size for the interposer 50.

In some embodiments, the spacing or pitch (Y1) between a buried ground via and an adjacent signal or ground via in the second direction (along the column) is smaller than the spacing or pitch (X1) between the vias in the first direction (along the row). In one example, the pitch X1 between adjacent vias in the first direction is 1.0 mm while the pitch Y1 between a buried ground via and an adjacent via in the second direction is 0.6 mm By using the buried ground vias, the signal integrity of the connector is improved without any increase or with only minimal increase in the size of the connector.

Figure 7A:
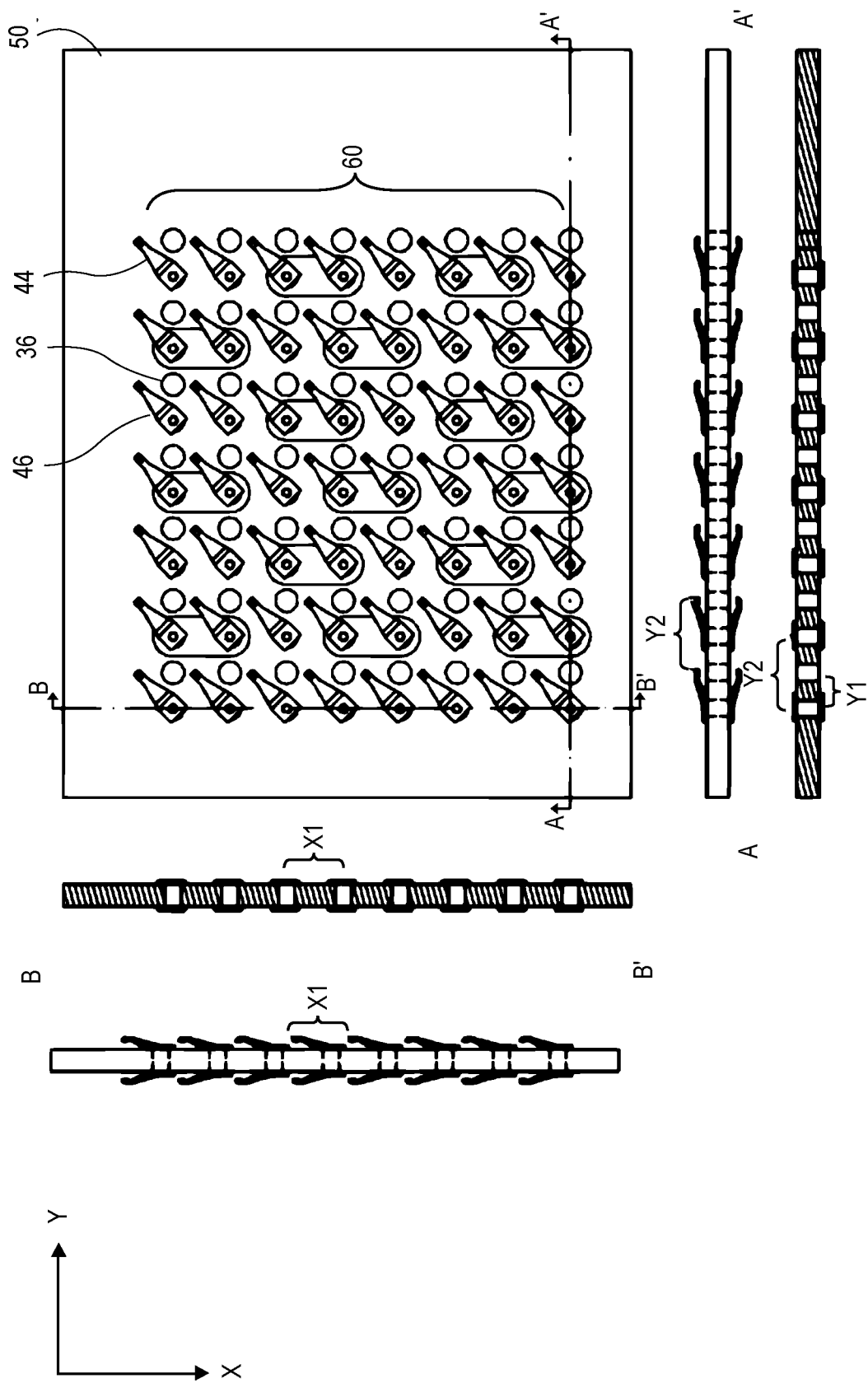
FIG. 7A illustrates the top and corresponding cross-sectional views of the contact array of the interposer of FIG. 5 in embodiments of the present disclosure.
Figure 7B:
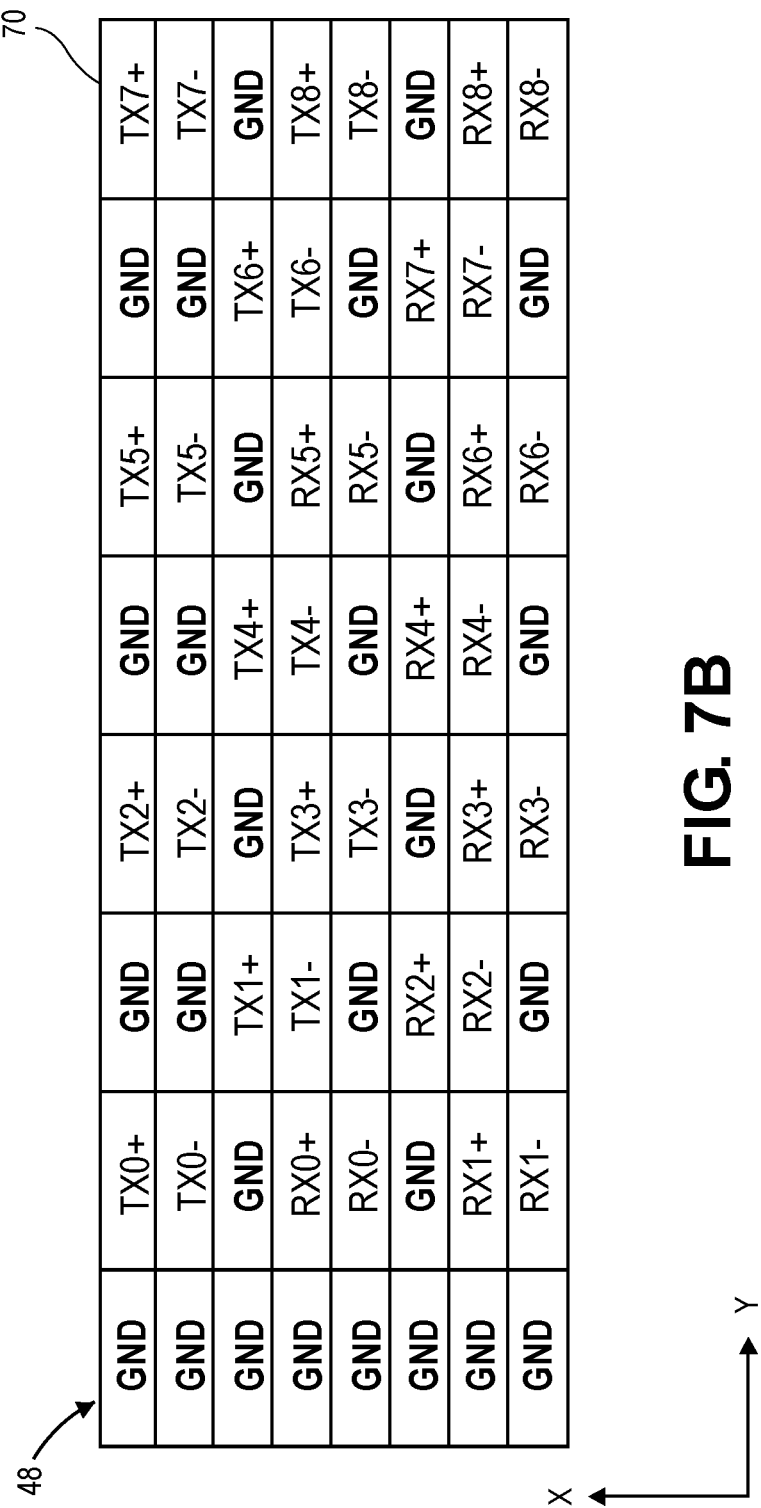
FIG. 7B illustrates a pin map which can be applied to the interposer in FIG. 7A in some examples.

FIG. 7A illustrates the top and corresponding cross-sectional views of the contact array of the interposer of FIG. 5 in embodiments of the present disclosure. FIG. 7B illustrates a pin map which can be applied to the interposer in FIG. 7A in some examples. Referring first to FIG. 7B, the pin map 70 illustrates one exemplary signal and ground pins layout for the interposer 50 of the present disclosure. The layout includes a ground pin row 48 for receiving the ground potential from the component to be connected. The layout further includes differential signal pairs of transmit (TX) and receive (RX) signals. Adjacent differential signal pairs are isolated from each other by ground pins in the first direction (X). However, adjacent differential signal pairs are not isolated from each other in the second direction (Y) by ground pins. Instead, as shown in FIG. 7A, each pair of differential signal pins 44 are shielded from adjacent pairs of differential signal pins 44 by buried ground vias 36 in the second direction (Y). By using the buried ground vias 36, the interposer 50 of the present disclosure can maintain a compact size while providing high signal integrity differential signaling without needing to surround each pair of differential signal pins with ground pins.

In high speed applications, differential signal pairs normally cannot be placed in adjacent positions as noise easily transfers from one differential pair to the next. Conventional PCIe connectors have grounded contact elements positioned between every adjacent pair of differential signal pins. The conventional method increases pin count and connector size and required additional PCB footprint. In embodiments of the present disclosure, buried ground vias, formed without contact elements, provide shielding of the differential signal pins without increasing the size of the connector. In particular, the buried ground vias are formed hidden in the core of the connector between adjacent pairs of signal pins. The buried ground vias provide crosstalk isolation in close proximity to the signal vias, resulting in improved signal integrity in a much more compact physical space. Furthermore, the connector of the present disclosure is formed in an area array configuration to enable large number of differential signal pair connections.

FIG. 7A further illustrates the cross-sectional views of contact array 60 along the first direction (along the line B-B') and along the second direction (along the line A-A'). In the first direction, the conductive vias, which can be signal via or ground vias, are separated by a spacing or a pitch of X1, for example, 1 mm. The contact elements likewise are separated by a pitch of X1 (e.g., 1 mm) Meanwhile, in the second direction, the conductive vias, which can be signal via or ground vias, are separated by a spacing or a pitch of Y1, such as 0.63 mm Meanwhile, the contact elements are separated by a pitch of Y2, such as 1.27 mm Thus, even though an adjacent pair of contact elements in the second direction are spaced apart by the buried ground via, the pitch (Y2) between the contact elements is not doubled of the pitch X1 in the first direction. Rather, the pitch Y2 is only slightly bigger than the pitch X1. In this manner, the interposer maintains a compact size while providing effective ground shielding of the signal pins.

Figure 8:
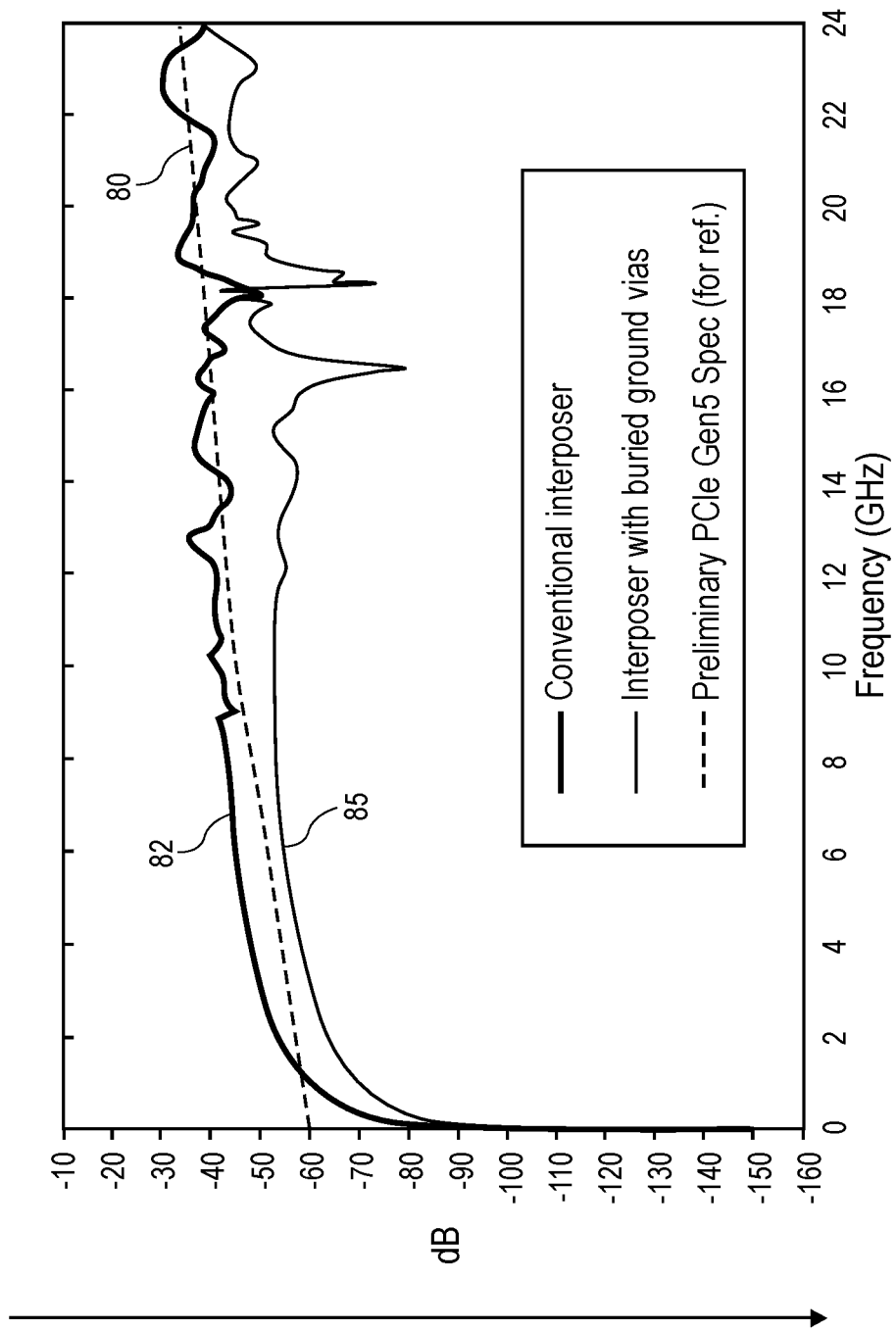
FIG. 8 is a plot illustrating the near end crosstalk measured between two adjacent signals in interposers with or without the use of buried ground vias in some examples.

FIG. 8 is a plot illustrating the near end crosstalk measured between two adjacent signals in interposers with or without the use of buried ground vias in some examples. Referring to FIG. 8, curve 80 denotes the desired crosstalk level according to industry specification PCIe Gen 5. Curve 82 illustrates the near end crosstalk performance of an interposer without using buried ground vias and curve 85 illustrates the near end crosstalk performance of an interposer of the present disclosure using buried ground vias. As can be seen from the plot, the crosstalk performance of the interposer with buried ground vias (curve 85) has lower dB value as compared to the cross-talk performance of the interposer without buried ground vias (curve 82). Curve 85 illustrates that significant cross-talk reduction can be achieved by using buried ground vias in the interposer.

As discussed above, embodiments of the present disclosure describe an interposer or a connector where pairs of signal pins are isolated by ground pins and buried ground vias. The pairs of signal pins can be used to transmit a differential signal pair. In alternate embodiments, the interposer can be constructed for transmitting single-ended signals or open-ended signals. In that case, a single signal pin is isolated by ground pins and buried ground vias from adjacent signal pins. Furthermore, in other embodiments, the interposer can be formed where two or more signal pins are grouped and isolated by ground pins and buried ground vias. Various configurations of the signal pins are possible within the scope of the present disclosure.

Figure 9:
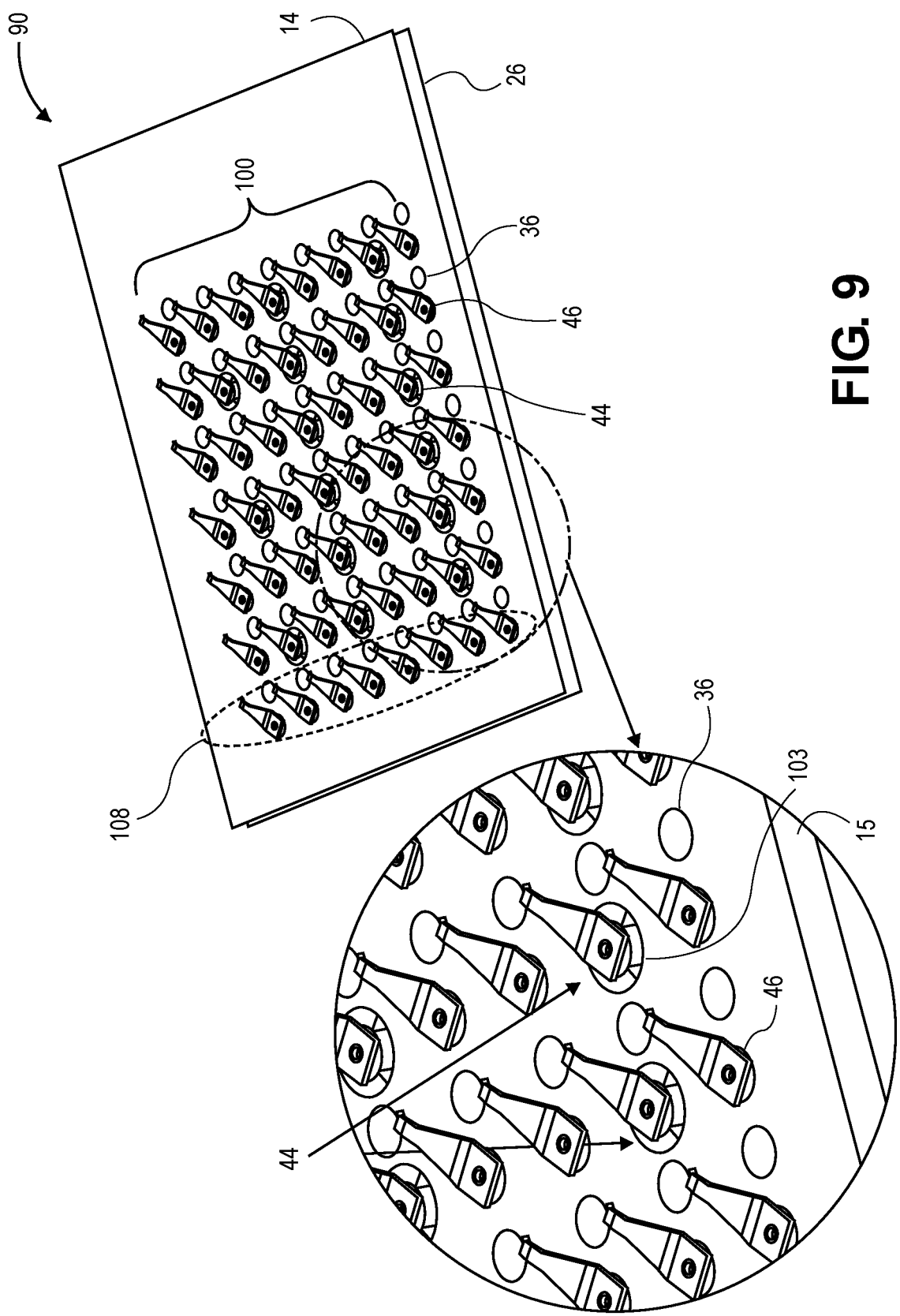
FIG. 9 is a perspective view of an interposer illustrating a contact array configured for single-ended or open-ended signals in embodiments of the present disclosure.

FIG. 9 is a perspective view of an interposer illustrating a contact array configured for single-ended or open-ended signals in embodiments of the present disclosure. Like elements in FIG. 9 and in previous figures are given like reference numerals to simplify the discussion. Referring to FIG. 9, an interposer 90 includes a contact array 100 formed in a core 15 with an upper ground plane 14 and a lower ground plane 26 formed on two opposing surfaces of the core 15. In the embodiment shown in FIG. 9, the interposer 90 is constructed for single-end pins or open ended signal pins 44. In the present embodiment, the signal pins 44 and the ground pins 46 are arranged in a two-dimensional array to form the contact array 100 of the interposer. The signal pins 44 are isolated from the top (upper) ground plane 14 and the bottom (lower) ground plane 26 by ground slots or openings 103 formed in the ground planes. Meanwhile, the ground pins 46 are electrically connected to at least one of the ground planes 14, 26. In the present illustration, the contact array 100 includes a row 108 of ground pins for receiving the ground potential from a component connected to the interposer 90.

In the present embodiment, a single signal pin 44 is formed in a ground slot 103. The signal pins 44 can be used for single-ended signaling or open-ended signaling. The contact array 100 is arranged so that each signal pin 44 s shielded from adjacent signal pins 44 by at least one ground pin 46, or at least one buried ground via 36, or a combination thereof. In this manner, each signal pin 44 is shielded from the adjacent signal pins 44, even though adjacent signal pins are not separated by ground pins in between.

Figure 10:
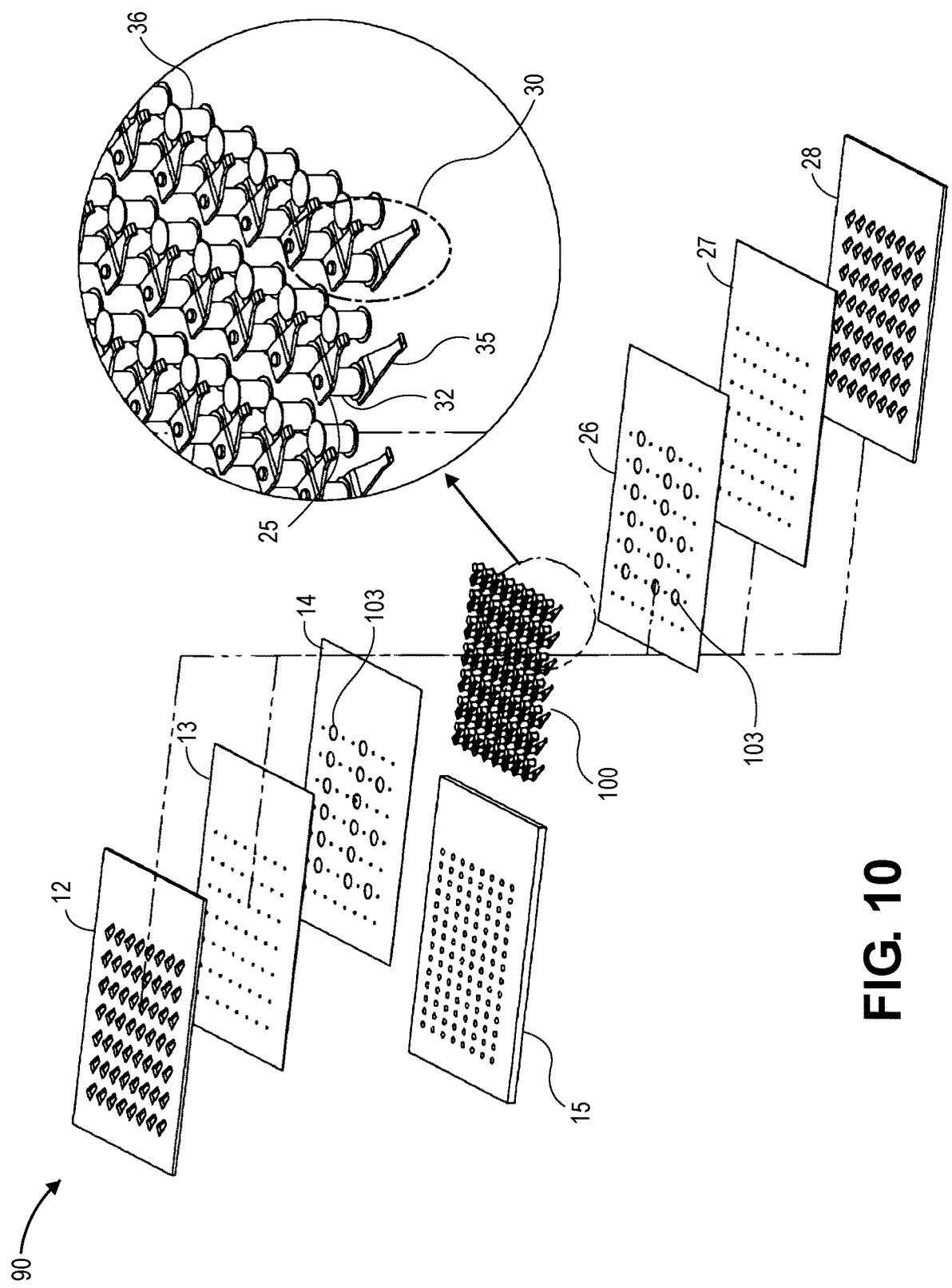
FIG. 10 is an exploded view of the interposer of FIG. 9 in embodiments of the present disclosure.

FIG. 10 is an exploded view of the interposer of FIG. 9 in embodiments of the present disclosure. Referring to FIG. 10, in some embodiments, the construction of the interposer 90 of the present disclosure includes a top coverlay isolation layer 12, a top adhesive layer 13, a top ground plane 14, an isolation layer 15 (or a core), a bottom ground plane 26, a bottom adhesive layer 27 and a bottom coverlay isolation layer 28. Conductive vias 32 are formed in the isolation layer 15 to connect to contact elements 25 formed on the top surface to contact elements 35 formed on the bottom surfaces. Contact structures 30 are formed and arranged in the layers to form signal pins and ground pins. In particular, each contact structure 30 includes a conductive via 32 formed in the isolation layer 15 and contact elements 25, 35 on both surfaces of the interposer 90. In the present embodiment, the same type of contact elements is used for the top surface and the bottom surface and the contact elements are illustrated as compliant spring probes. The contact structures shown in FIG. 10 are illustrated only and not intended to be limiting. In other embodiments, other types of contact elements may be used and different types of contact elements may be used on the two surfaces of the interposer. In embodiments of the present disclosure, the contact elements and the conductive vias can be formed using any process currently known or to be developed.

For interposer 90, the contact array 100 is configured for single-ended or open-ended signals. Therefore, in the ground planes 14 and 26, ground slots 103 are provided to isolate a single conductive via 32 only. This is in contrast to the embodiments in FIGS. 2 and 5 where the ground slots are made to accommodate and isolate two adjacent conductive vias.

Figure 11:
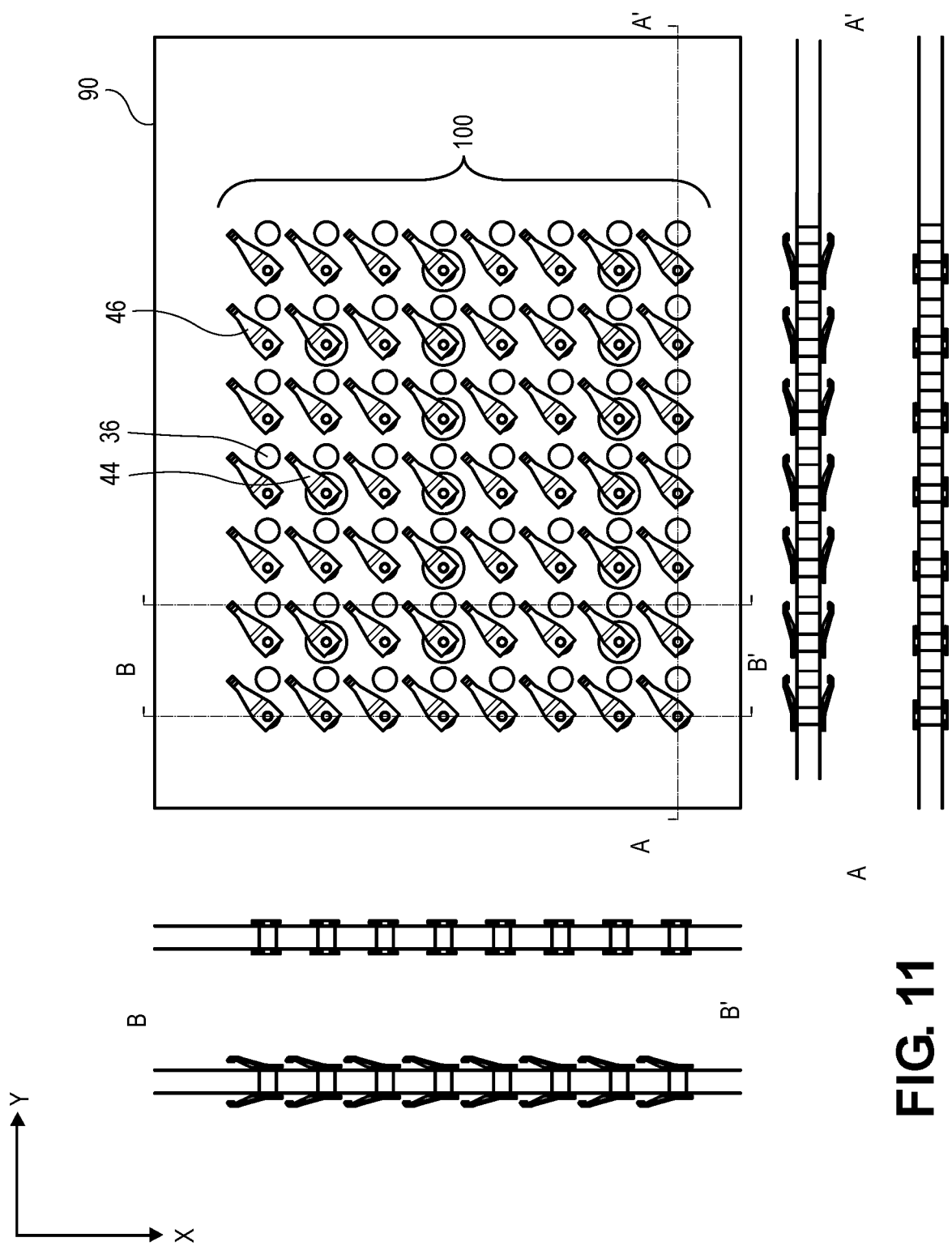
FIG. 11 illustrates a top view and corresponding cross-sectional views of the conductive elements of the contact array of the interposer in FIG. 10 in embodiments of the present disclosure.

FIG. 11 illustrates a top view and corresponding cross-sectional views of the conductive elements of the contact array of the interposer in FIG. 10 in embodiments of the present disclosure. Referring to FIG. 11, each signal pin 44 is shielded from adjacent signal pins 44 by buried ground vias 36 in the second direction (Y) and is shielded from adjacent signal pins 44 by ground pins 46 in the first direction (X). In the present embodiment, each signal pin 44 is isolated from other signal pins 44 in the first direction by two ground pins 46. By using the buried ground vias 36, the interposer 90 of the present disclosure can maintain a compact size while providing high signal integrity without needing to surround each signal pin with ground pins. The cross-sectional views illustrate the smaller pitch being used for the conductive vias in the first direction (X) as compared to the second direction (Y).

In the above described embodiments, the conductive structures are formed with conductive vias extending in the Z direction only, the Z direction being orthogonal to the X and Y directions. In other embodiments, the conductive structure can include co-planar layers where conductive traces are formed on additional layers in the core to route signals in the X-Y direction within the interposer. In embodiments of the present disclosure, a connector is formed using a substrate having conductive traces formed in co-planar layers. Such a substrate is referred to as a circuitized substrate in the present disclosure. In some examples, the conductive traces may be used to connect contact elements at a first location on a first surface of a substrate to contact elements at a second location on the first surface of the substrate, the first location and the second location being located at different X-Y plane locations. That is, the first and second locations are not next to each other but are typically located at different portions of the substrate, such as left and right portions. In one application, a connector formed using a circuitized substrate functions as a bridge to connect signal pads on a first PC board to signal pads on a second PC board. In some examples, such a connector is referred to as PCBridge.

Figure 12A:
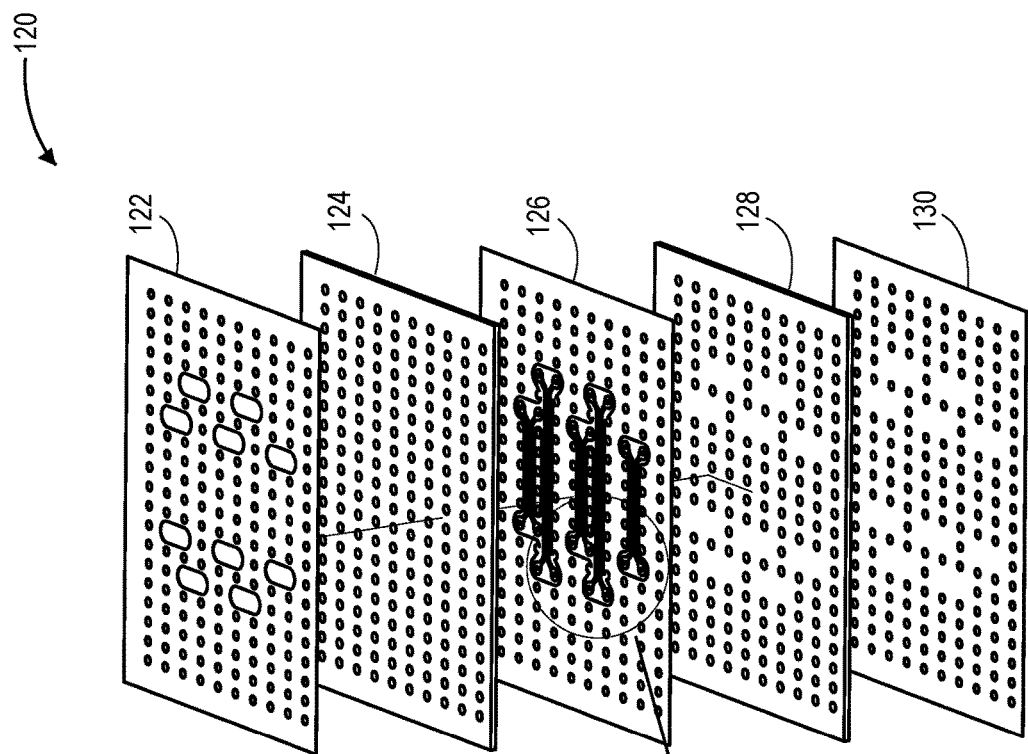
FIG. 12A is a perspective view and FIG. 12B is an exploded view of a circuitized substrate containing conductive traces in alternate embodiments of the present disclosure.
Figure 12B:
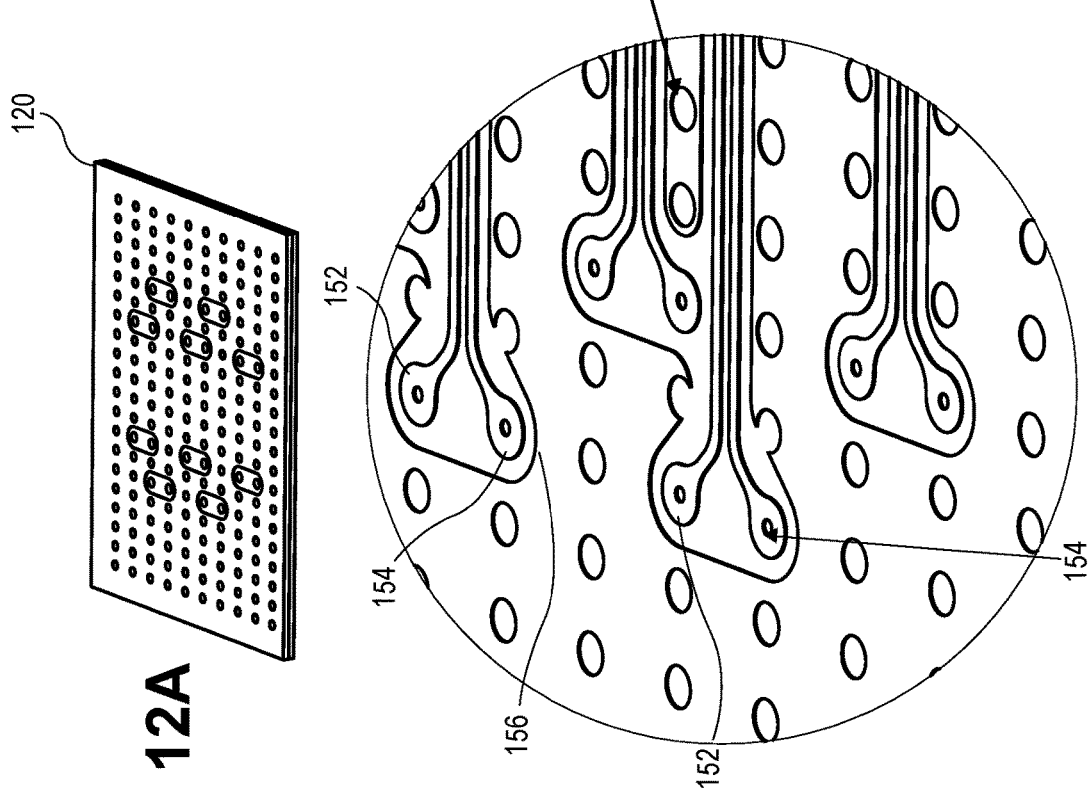

FIG. 12A is a perspective view and FIG. 12B is an exploded view of a circuitized substrate containing conductive traces in alternate embodiments of the present disclosure. Referring to FIG. 12A, an interposer is to be formed using a circuitized substrate 120 as the core of the interposer. The circuitized substrate includes an upper ground plane with ground slots for accommodating contact elements formed on a first portion (e.g. left) and a second portion (e.g. right) of the substrate. Referring to FIG. 12B, the circuited substrate 120 includes an upper ground plane 122, an upper isolation layer 124, a middle ground plane 126, a lower isolation layer 128 and a lower ground plane 130. As this configured, the upper ground plane 122 is isolated from the middle ground plane 126 which is isolated from the lower ground plane 130. The circuitized substrate 120 includes conductive signal traces 152, 154 formed on the middle ground plane 126. The conductive signal traces 152, 154 are isolated from but surrounded by the ground layer formed on the middle ground plane 126, such as by slots or openings 156 formed around the conductive signal traces. In this manner, the conductive signal traces 152, 154 are shielded by the isolation layers 124, 128 from the adjacent ground planes 122, 130 and are also shielded from other signal traces on the middle ground plane 126 by being isolated from but surrounded by the conductive ground layer on the middle ground plane 126. In some embodiments, the conductive signal traces 152, 154 are used as a pair of differential signal traces. In some embodiments, a solder mask is provided under the bottom ground plane 130 to cover and protect the bottom ground plane.

Figure 13:
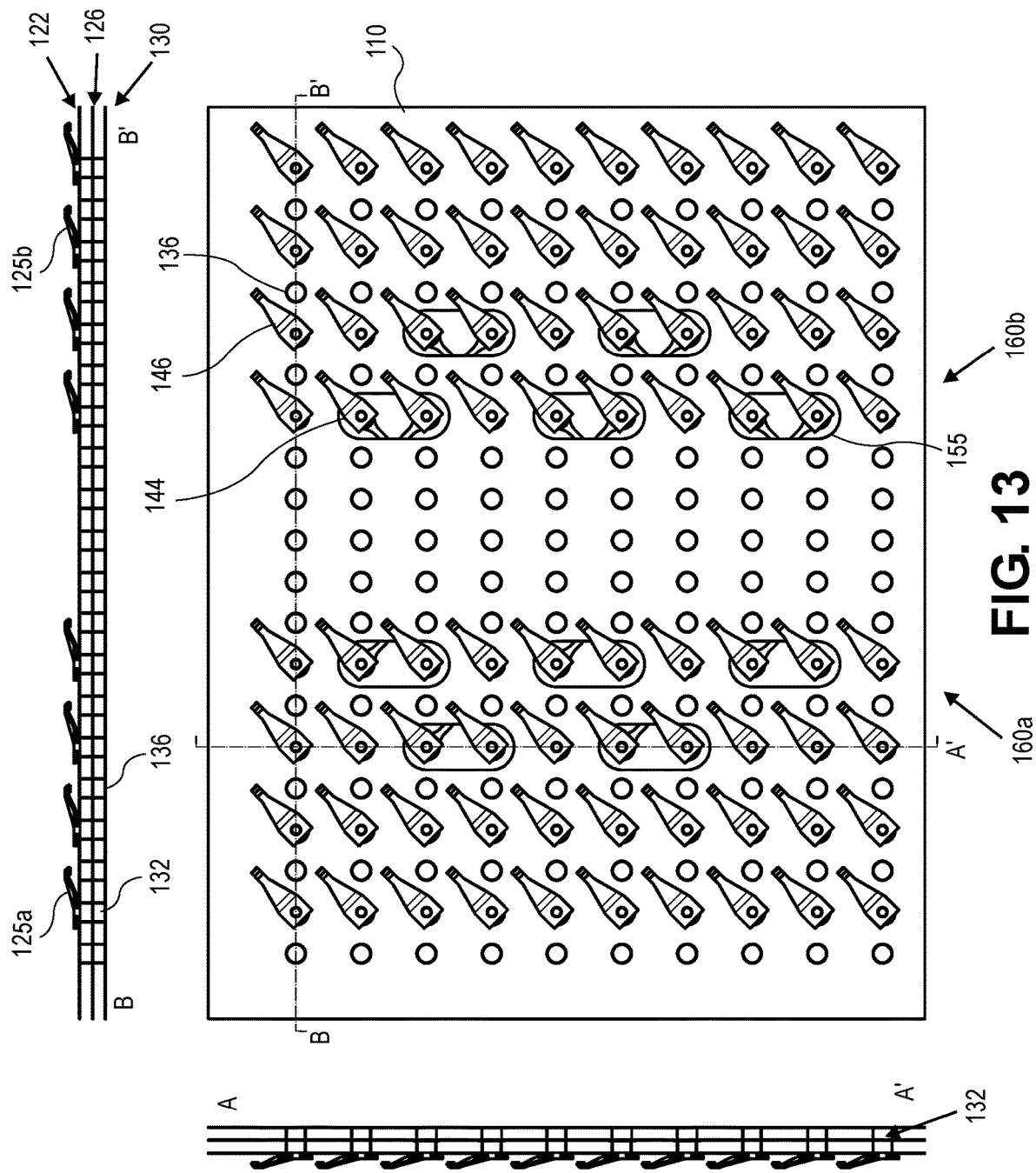
FIG. 13 illustrates a top view and corresponding cross-sectional views of the conductive elements of an interposer incorporating the circuitized substrate of FIGS. 12A and 12B in alternate embodiments of the present disclosure.

FIG. 13 illustrates a top view and corresponding cross-sectional views of the conductive elements of an interposer incorporating the circuitized substrate of FIGS. 12A and 12B in alternate embodiments of the present disclosure. Referring to FIG. 13, an interposer 110 formed from the circuitized substrate 120 of FIG. 12B includes upper, middle, and lower ground planes 122, 126, 130, respectively, separated by isolation layers. Conductive vias 132 for signal pins 144 are formed in the circuitized substrate 120 and isolated from all of the ground planes. The middle ground plane 126 may be circuitized as shown in FIG. 12B such that contact elements 125a on one side of the interposer 110 (e.g. left) is routed to and connected to a contact element 125b at a second side (e.g. right) of the interposer. In FIG. 13, the signal pins 144 are configured for differential signaling where a pair of signal pins 144 are formed in a slot 155 to be isolated from all of the ground planes. Each pair of signal pins 144 is isolated from other pairs of signal pins 144 by either ground pins 146 or buried ground vias 136.

With the use of the circuitized substrate 120 of FIGS. 12A and 12B, the contact array of interposer 110 includes contact elements organized into two groups. In particular, a first group 160a of contact elements are arranged on a first side (e.g. left side) of the interposer while a second group 160b of contact elements are arranged on a second side (e.g. right side) of the interposer. The conductive signal traces formed on the circuitized substrate connect signal pins in the first group 160a to signal pins in the second group. In this manner, the interposer 110 can be applied as a bridge to connect signal pins of two components together. For example, a first component can be coupled to the first group 160a of contact elements and a second component can be coupled to the second group 160b of contact elements. The conductive signal traces formed on the circuitized substrate provides the electrical connection between signal pins of the two components. In the present embodiment, contact elements for the two groups are provided on the same surface of the interposer 110. The interposer 110 therefore connects to two components as a bridge between the two components.

Figure 14:
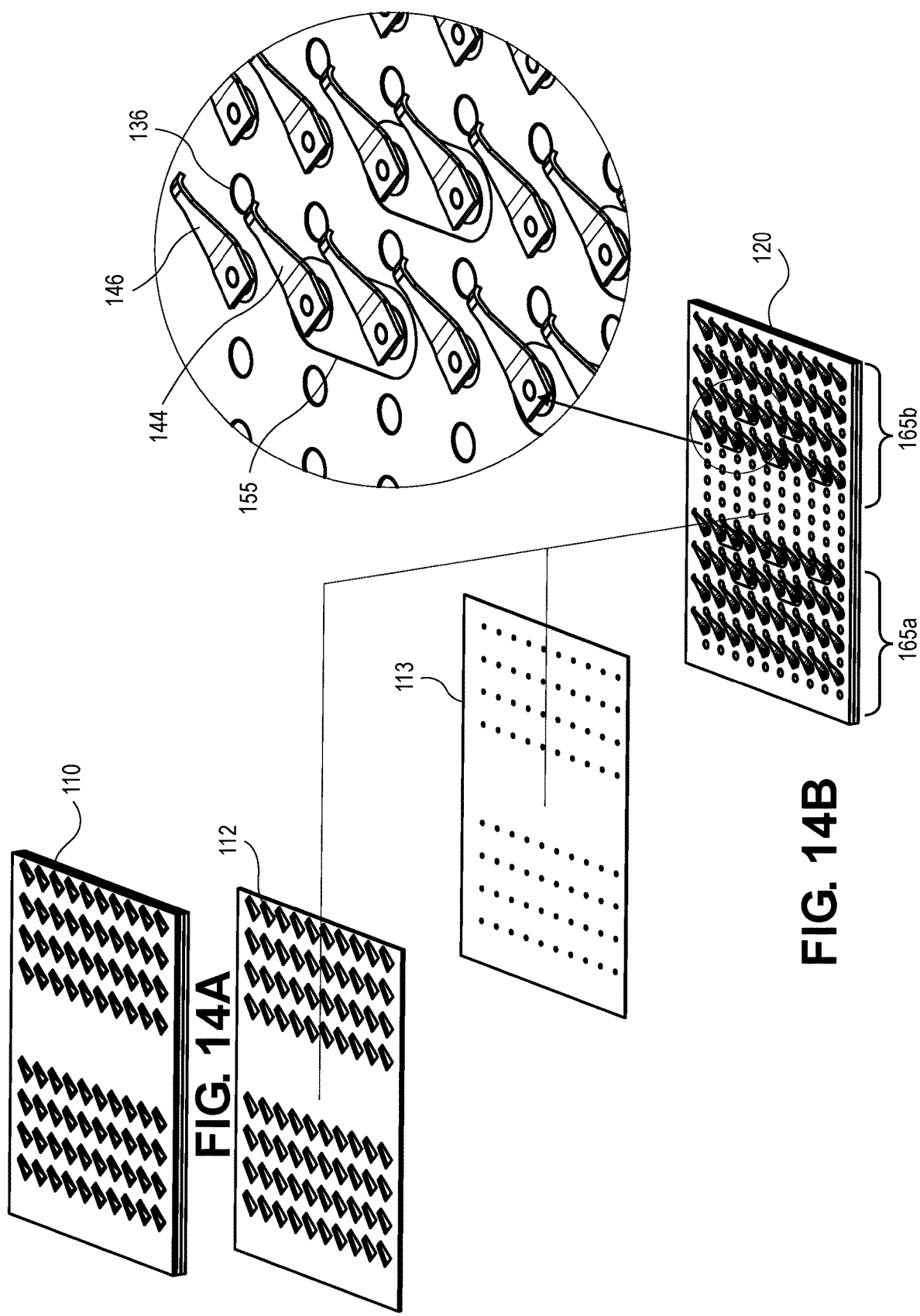
FIG. 14A is an assembled interposer of an alternate embodiment of the present disclosure.
FIG. 14B is a partially exploded view of the interposer of FIG. 14A in some embodiments.

FIG. 14A is an assembled interposer of an alternate embodiment of the present disclosure. FIG. 14B is a partially exploded view of the interposer of FIG. 14A in some embodiments. Referring to FIGS. 14A and 14B, in some embodiments, the interposer 110 of the present disclosure includes a coverlay isolation layer 112, an adhesive layer 113, and the circuitized substrate 120 of FIG. 12B with contact structures to form a circuitized interposer 110. In the present embodiment, pairs of signal pins 144 form differential signal pairs. A subset of the differential signal pins 144 is connected to the differential signal traces formed in the circuitized substrate, such as those formed on a middle ground plane. Accordingly, a differential signal pair formed by contact elements on a first side 165a (e.g. left side) of the interposer may be connected to contact elements forming differential signal pair on a second side 165b (e.g. right side) of the interposer. The first side and the second side of the interposer are spaced apart from each other. As thus constructed, the interposer functions as a PCBridge to connect signal connections between two PC boards. In particular, the contact elements forming the signal pins 144 for both sides are provided on the same surface of the interposer 110. A first PC board may be connected to the first side 165a and a second PC board may be connected to the second side 165b. The circuitized substrate 120 provides the electrical connection of signal pins 144 between the two PC boards.

Figure 15:
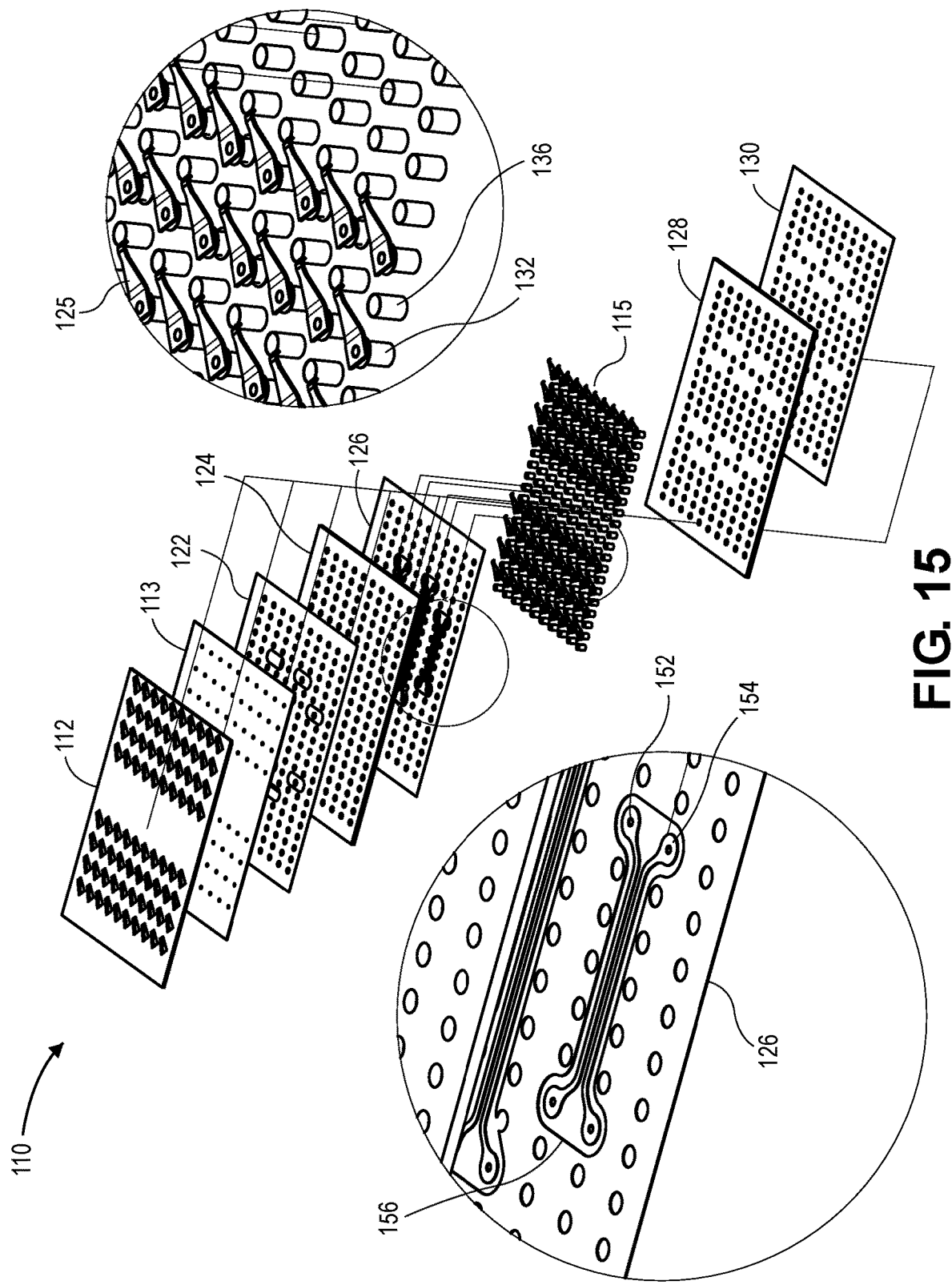
FIG. 15 is an exploded view of the interposer of FIGS. 14A and 14B in embodiments of the present disclosure.

FIG. 15 is an exploded view of the interposer of FIGS. 14A and 14B in embodiments of the present disclosure. Referring to FIG. 15, in some embodiments, the construction of the circuitized interposer 110 of the present disclosure includes a top coverlay isolation layer 112, a top adhesive layer 113, an upper ground plane 122, an upper isolation layer 124, a middle ground plane 126 with conductive signal traces 152, 154, a lower isolation layer 128 and a lower ground plane 130. An isolation layer, such as a solder mask may be provided under lower ground plane 130 for isolation and protection. Conductive vias 132 are formed in the core to connect to contact elements 125 formed on the top surface of the interposer. Contact structures are formed and arranged in the layers to form signal pins 144 and ground pins 146 (FIG. 14B). In the present embodiment, the contact elements 125 are illustrated as compliant spring probes. The middle ground plane 126 includes conductive signal traces 152, 154 formed thereon where the conductive signal traces are isolated from the ground layer by slots 156. In the present embodiment, the conductive signal traces 152, 154 are formed as differential signal traces. At least some of the signal pin pairs are connected to the differential signal traces formed on the middle ground plane 126. The conductive signal traces 152, 154 operate to route signals from contact elements at one side (e.g. left side) of the interposer to contact elements at another side (e.g. right side) of the interposer.

In the present embodiments, the circuitized substrate is described as providing routing of signals from one side of the interposer to another side. The arrangement described above is illustrated only and not intended to be limiting. One of ordinary skill in the art would appreciate that the conductive signal traces in the circuitized substrate can be arranged or patterned in any desirable configurations to provide connections between a first group of contact elements and a second group of contact elements.

In this detailed description, various embodiments or examples of the present invention may be implemented in numerous ways, including as a process; an apparatus; a system; and/or a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A connector for electrically connecting to conductive structures formed on an electronic component, comprising:
    a core comprising a first ground plane, a second ground plane, and a third ground plane, the first, second and third ground planes being isolated from each other, the core further comprising a plurality of signal vias and a plurality of ground vias, each ground vias being electrically connected to at least one of the first, second or third ground plane;
    conductive signal traces formed coplanar with the second ground plane and isolated from a conductive ground layer forming the second ground plane, each conductive signal trace having a first end and a second end, one or more conductive signal traces forming a group of traces being shielded by the conductive ground layer of the second ground plane and further being shielded by the first and third ground planes;
    a first set of contact elements formed on a first surface of the core and electrically connected to the signal vias that are electrically connected to the first ends of the conductive signal traces to form a first set of signal pins; and
    a second set of contact elements formed on the first surface of the core and electrically connected to the signal vias that are electrically connected to the second ends of the conductive signal traces to form a second set of signal pins, the signal vias and the contact elements in the first and second sets being electrically isolated from the first, second and third ground planes.

2. The connector of claim 1, wherein the first set of the contact elements are positioned at a first portion of the core and the second set of the contact elements are positioned at a second portion of the core spaced apart from the first portion, each conductive signal traces connecting a respective contact element in the first set to a respective contact element in the second set.

3. The connector of claim 1, wherein the first ground plane and the second ground plane are isolated from each other by a first isolation layer, and the second ground plane and the third ground plane are isolated from each other by a second isolation layer.

4. The connector of claim 1, wherein each group of conductive signal traces comprises a single signal trace or a pair of conductive signal traces, each group of conductive signal traces being shielded from another group of conductive signal traces by the conductive ground layer of the second ground plane.

5. The connector of claim 1, further comprising:
    a third set of contact elements formed on the first surface of the core and electrically connected to a subset of the plurality of ground vias to form a first set of ground pins, remaining ground vias without contact elements connected thereto forming a set of buried ground vias, wherein the first, second and third sets of contact elements are arranged on the first surface of the core to surround each signal pin by at least one adjacent ground pin and one or more adjacent buried ground vias.

6. The connector of claim 5, wherein the signal vias and the ground vias are arranged in a two-dimensional array in the core; and the first, second and third sets of contact elements are arranged in a two-dimensional array on the first surface of the core.

7. The connector of claim 6, where in each signal pin is arranged adjacent to at least one ground pin in a first direction of the two-dimensional array and is arranged adjacent to one or more buried ground vias in a second direction of the two-dimensional array, the second direction being perpendicular to the first direction, each signal pin being shielded from adjacent signal pins by at least one ground pin and at least one buried ground via.

8. The connector of claim 1, wherein the first and the second sets of contact elements are each arranged on the first surface of the core to form pairs of signal pins, each pair of signal pins being surrounded by at least one adjacent ground pin and one or more adjacent buried ground vias.

9. The connector of claim 1, wherein the first and second sets of contact elements are each arranged on the first surface of the core to form single-ended signal pins, each signal pin being surrounded by at least one adjacent ground pin and one or more adjacent buried ground vias.

10. The connector of claim 8, wherein each pair of signal pins forms a differential signal pair.

11. The connector of claim 8, wherein a first pair of contact elements in the first set are electrically connected to the first ends of a pair of conductive signal traces through the signal vias and a second pair of contact elements in the second set are electrically connected to the second ends of the same pair of conductive signal traces through the signal vias, the first pair of contact elements being electrically connected to the second pair of contact elements through the pair of conductive signal traces.

12. The connector of claim 1, wherein each signal via and each contact element in the first and second sets are isolated from the first and second ground planes by slots formed in the first and second ground planes.

13. The connector of claim 1, wherein the conductive signal traces are isolated from the conductive ground layer on the second ground plane by slots formed in the conductive ground layer.

14. The connector of claim 1, wherein each contact element comprises a compliant spring probe.

15. The connector of claim 7, wherein adjacent vias formed in the core are separated by a first distance in the first direction and adjacent vias formed in the core are separated by a second distance in the second direction, the second distance being smaller than the first distance.

16. The connector of claim 13, wherein adjacent contact elements formed on the first surface are separated by a third distance in the first direction and adjacent contact elements formed on the first surface are separated by a fourth distance in the second direction, the third distance being smaller than the fourth distance.

17. The connector of claim 1, wherein each of the plurality of signal vias and the plurality of ground vias formed in the core comprises a conductive sidewall layer or a conductive interconnect formed in an opening in the isolation layer.

18. The connector of claim 1, wherein each of the plurality of signal vias and the plurality of ground vias formed in the core comprises one of conductive paste, a fuzz button, a metal pin, or a slug placed into an opening in the core.

* * * * *